United States Patent [19]

Lauffer et al.

[11] Patent Number: 5,665,650
[45] Date of Patent: Sep. 9, 1997

[54] METHOD FOR MANUFACTURING A HIGH DENSITY ELECTRONIC CIRCUIT ASSEMBLY

[75] Inventors: John Matthew Lauffer, Waverly, N.Y.; Donald Herman Glatzel, New Milford, Pa.; David John Russell, Apalachin, N.Y.

[73] Assignee: International Business Machines Corporation, Armonk, N.Y.

[21] Appl. No.: 675,458

[22] Filed: May 30, 1996

[51] Int. Cl.⁶ .................................................. H01L 21/60
[52] U.S. Cl. ........................................................ 216/20
[58] Field of Search ................................ 437/195, 205, 437/209; 216/20

[56] References Cited

U.S. PATENT DOCUMENTS

| | | | |
|---|---|---|---|
| 4,420,364 | 12/1983 | Nukii et al. | 216/20 |
| 4,893,404 | 1/1990 | Shirahata et al. | 29/852 |
| 4,991,060 | 2/1991 | Kawakami et al. | 361/778 |
| 5,065,227 | 11/1991 | Frankeny et al. | 257/778 |
| 5,078,831 | 1/1992 | Miyazaki et al. | 216/20 |
| 5,079,065 | 1/1992 | Masakazu et al. | 428/137 |
| 5,220,723 | 6/1993 | Okada | 216/20 |
| 5,234,536 | 8/1993 | Parthasarathi et al. | 216/20 |
| 5,260,518 | 11/1993 | Tanaka et al. | 361/760 |
| 5,317,801 | 6/1994 | Tanaka et al. | 29/830 |

FOREIGN PATENT DOCUMENTS 2-45998  2/1990  Japan.

OTHER PUBLICATIONS

"New Avenue for Microvias", Electronics Engineering Times, Mar. 18, 1996, p. 68.

*Primary Examiner*—Kevin Picardat
*Attorney, Agent, or Firm*—Jenkens & Gilchrist

[57] ABSTRACT

Photoimageable dielectric materials are coated on substrates, selectively exposed and developed, whereby small vias and interconnection openings are formed between adjacently spaced circuit layers. A conductive paste may be used to provide sequential layer interconnection and surface planarization. No adhesives are required in the manufacture of a circuit assembly having multiple circuit and dielectric layers, and the manufacturing method avoids the requirement for drilled through holes and blind vias.

15 Claims, 5 Drawing Sheets

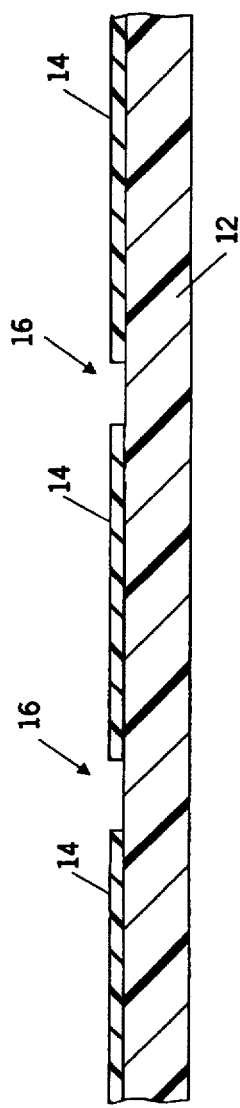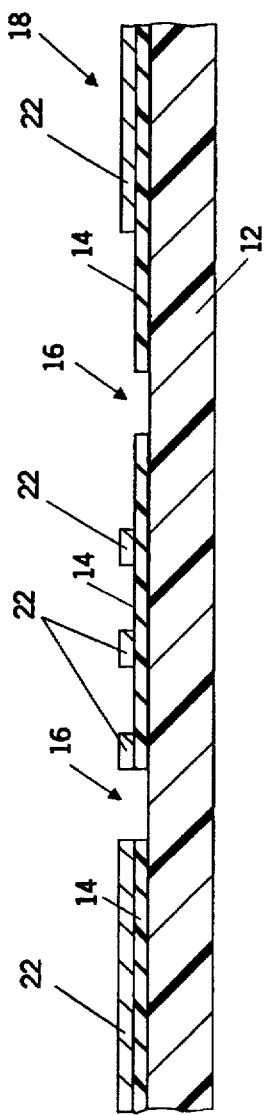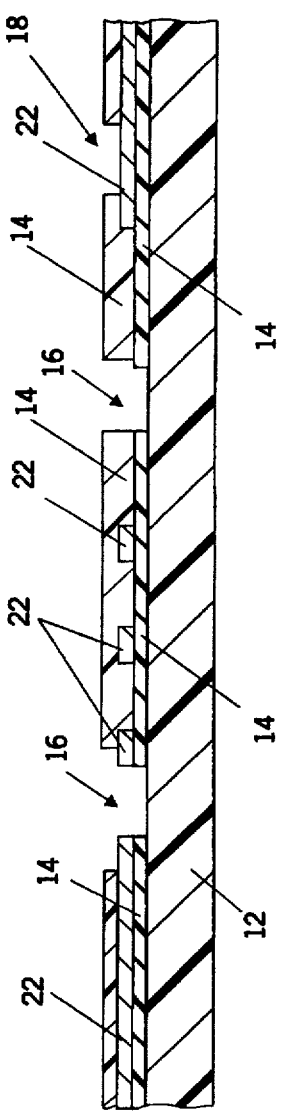

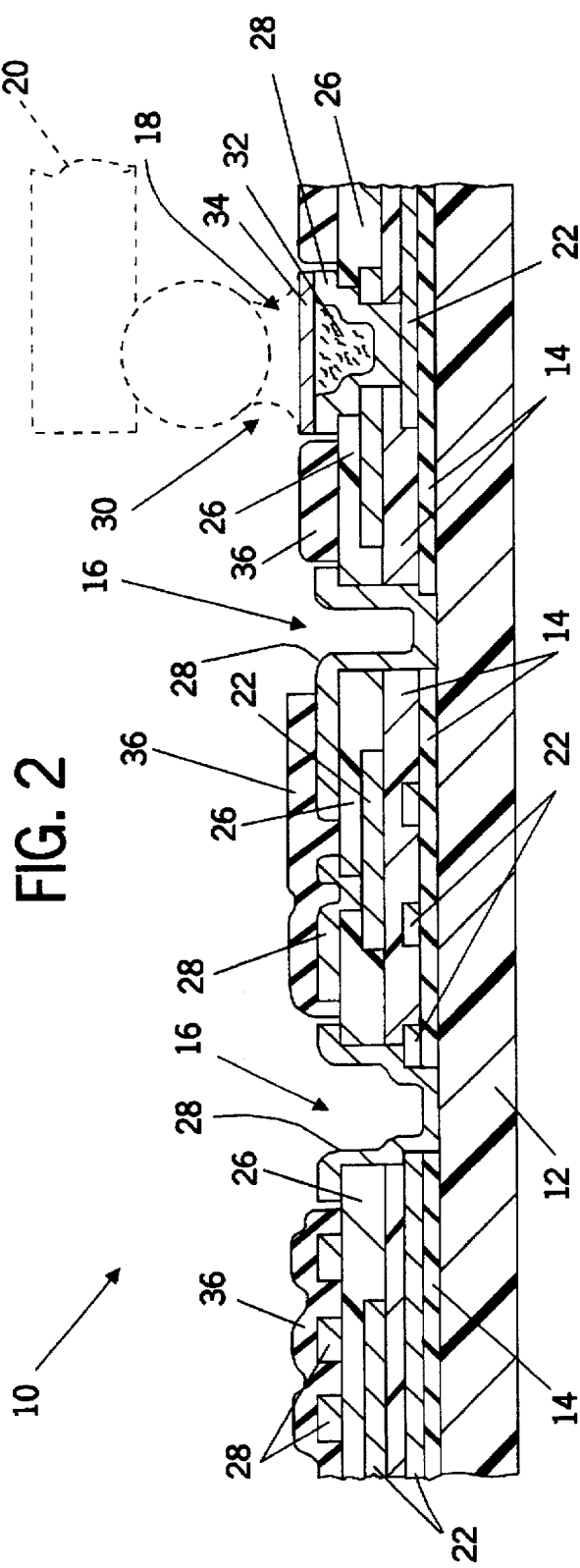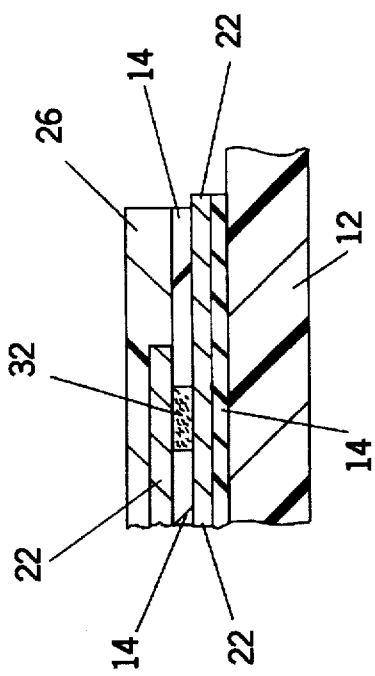

METHOD FOR MANUFACTURING A HIGH DENSITY ELECTRONIC CIRCUIT ASSEMBLY

BACKGROUND OF THE INVENTION

1. Technical Field

The present invention relates to the manufacture of electronic circuit assemblies, and more particularly to the manufacture of circuit assemblies having electrical circuits disposed as a plurality of layers separated by dielectric material.

2. Background Art

High density circuit assemblies are typically formed as sequentially added layers of circuitry on printed circuit boards (PCBs), metal sheets, ceramic substrates and the like. Such assemblies are typically formed by full additive metalization, for example by electroless or electrolytic plating or vacuum deposition. Full metalization processes are time consuming and suffer yield problems due to the inherent thickness non-uniformity of the circuitry. Also, it is generally necessary to drill through holes and blind vias as separate intermediate operations during the manufacturing process, adding to the cost of manufacture.

One method for forming multi layer circuit boards is disclosed in U.S. Pat. No. 5,260,518 issued Nov. 9, 1993 to Tanaka et at. The manufacturing method disclosed by Tanaka et al requires that stepped holes, of increasing diameter from lower to upper conductive layers, be bored or drilled during the manufacture to provide for conductive interconnection between electrical circuits disposed on different layers of the assembly. The increasingly larger diameters of the holes are required to solve the problem of misregistration of the holes when the layers are laminated. This practice not only increases the cost and complexity of manufacturing, but because of the required larger holes; also limits the spacing, or density, of interconnection sites in the circuit assembly. Accordingly, the circuits have lower component density which requires larger board areas and increases the overall size of the circuit assembly.

Other methods of forming multiple layered electrical circuit assemblies require the use of adhesive materials to bond the electrically conductive circuit layers to dielectric separating material. For example, U.S. Pat. No. 4,420,364 issued Dec. 13, 1983 to Nukii et al describes the use of high-insulation adhesive sheets in the construction of multiple layer circuit assemblies. Likewise, U.S. Pat. No. 5,234,536 issued Aug. 10, 1993 to Parthasarathi et al requires the use of adhesive materials to bond a metal foil layer to a substrate. In both of these constructions, holes must be provided through the adhesive materials so that selected portions of spaced apart circuit layers can be interconnected. These holes must be sufficiently large so that adhesive reflow during lamination does not occlude the interconnection site. As noted above, when relatively large holes are required for circuit interconnection, the spacing and density of vias and other interconnection sites is adversely limited. Accordingly, circuit assemblies formed through the use of adhesive bonding materials generally require more space for positioning of components, resulting in relatively large board areas and increased size of electronic circuits formed thereon.

The present invention is directed to overcoming the problems set forth above. It is desirable to have a method for manufacturing multiple layered electronic circuit assemblies that does not require the drilling of stepped holes of increasing diameter to provide for conductive interconnection between electrical circuits. It is also desirable to have such a manufacturing method that does not require the use of adhesive bonding materials, so that via and interconnection holes through the insulative material can be relatively small, permitting the formation of high density circuitry on the circuit layers. It is also desirable to have a manufacturing system for the formation of multiple layered high density electronic circuit assemblies that is economical and easily automated so that previous problems with registration of respective circuits on spaced apart layers are reduced.

SUMMARY OF THE INVENTION

In accordance with one aspect of the present invention, a method for manufacturing a high density electronic circuit assembly includes coating a substrate member with a photoimageable dielectric material, exposing selected portions of the coating to light, and then developing away the unexposed portions of the dielectric material. The coating is then partially cured and a layer of an electrically conductive material is laminated over the partially cured dielectric material. During the lamination process, the curing of the dielectric material continues and is substantially fully cured at the conclusion of the lamination process. One or more electrical circuits are then formed on the electrically conductive layer by selectively etching away unwanted portions of the conductive layer. An additional coating of a photoimageable dielectric material is then deposited over the electrical circuit layer, exposed and developed as described above, after which the additional coating is fully cured prior to selectively forming one or more electrical circuits on the cured additional coating.

Other features of the manufacturing process embodying the present invention include repetitively applying a photoimageable dielectric material coating over a previously formed electrical circuit layer, exposing, developing and partially curing the applied dielectric material, laminating a layer of electrically conductive material and circuitizing the electrically conductive layer, until a desired number of electrical layers are formed. Another feature includes simultaneously forming alternating dielectric and electrically conductive circuit layers on both sides of a substrate member. In yet another feature, defined voids are formed in the dielectric material by exposing selected areas and then developing the coating to remove unexposed material, and filling the resultant voids with an electrically conductive paste prior to laminating the electrically conductive material over the dielectric coating.

In accordance with another aspect of the present invention, a method for forming a chip attachment site on a previously formed circuit board includes filling predefined voids with an electrically conductive paste and laminating a layer of electrically conductive material onto the board and forming planar surface lands at each of the designated voids, thus providing planar chip attachment sites.

BRIEF DESCRIPTION OF THE DRAWINGS

FIGS. 1A–1F are sequentially arranged schematic diagrams of cross sections of the electronic circuit assembly, showing sequential formation of the circuit assembly in accordance with the preferred embodiment of the manufacturing method embodying the present invention;

FIG. 2 is a schematic diagram showing a cross section of the electronic circuit assembly formed in accordance with the preferred embodiment of the manufacturing method embodying the present invention, showing the circuit assembly after application of an optional solder masking material;

FIG. 3 is a schematic diagram showing a cross-sectional view of the electronic assembly formed in accordance with the preferred embodiment of the manufacturing method embodying the present invention, in which an electrically conductive paste provides electrical interconnection between spaced apart electronic circuit layers;

DETAILED DESCRIPTION OF A PRESENTLY PREFERRED EXEMPLARY EMBODIMENT

Multiple layered, high density electronic circuit assemblies, or boards, typically comprise a plurality of electronic circuits arranged in layers that are separated by layers of dielectric material that have appropriate holes, or vias, each of which provide for electrical interconnection between circuits on other layers. Also, vias are provided which provide electrical connection with components, such as semiconductor chips or chip carriers, that are mounted on the surface of the circuit assembly.

Figure 4:
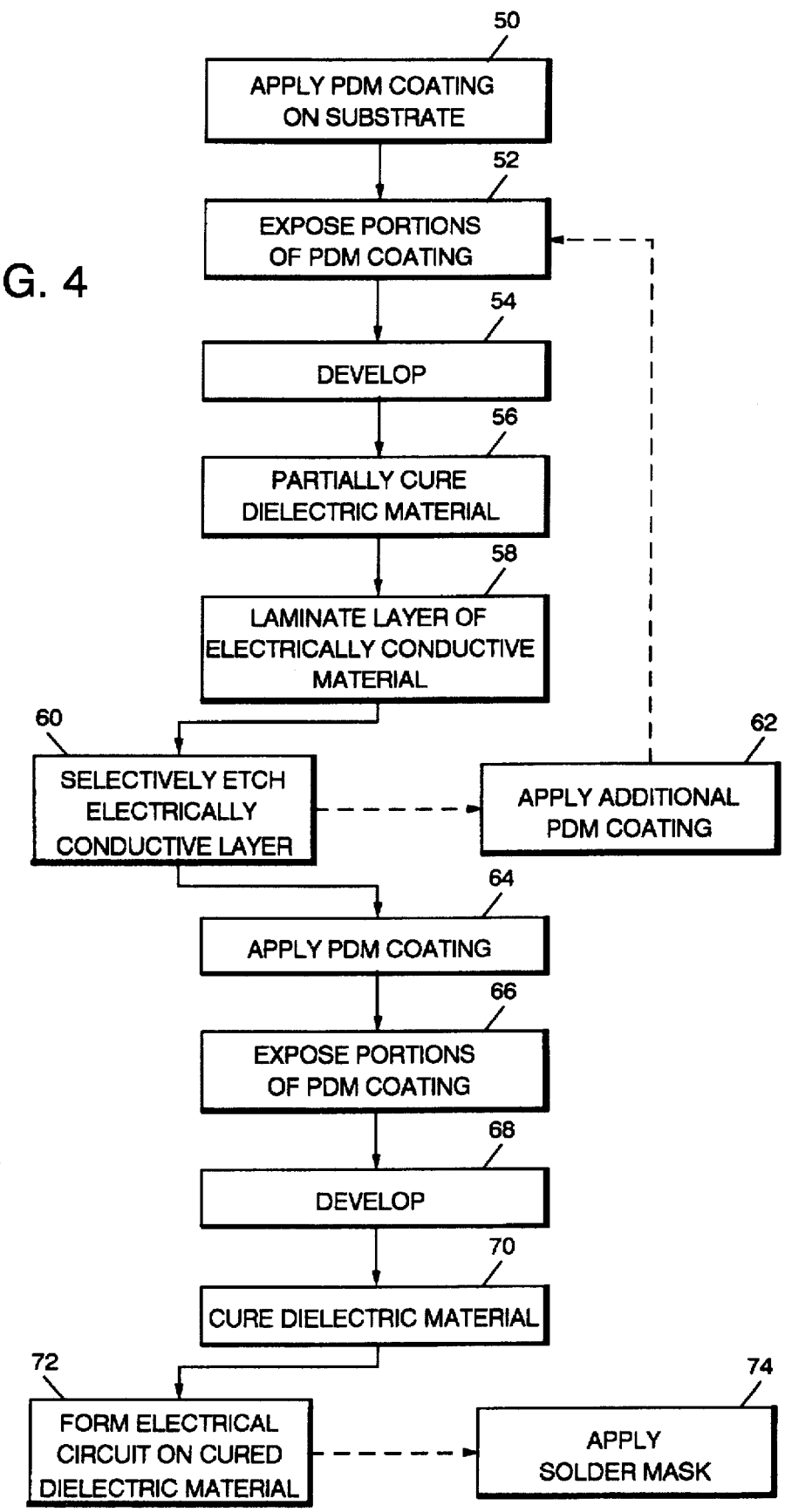
FIG. 4 is a block diagram illustrating the sequential steps carried out in the formation of an electronic circuit assembly in accordance with the preferred embodiment of the manufacturing process embodying the present invention.

In the preferred embodiment of the present invention, an electronic circuit assembly 10, or board, is manufactured as indicated at block 50 in FIG. 4 by initially coating a selected substrate 12, such as a preprinted circuit board, a metal or ceramic plate, or other planar structure with a photoimageable dielectric material 14 (PDIVl), such as IBM's Advanced SolderMask (ASM) which is described in U.S. Pat. Nos. 5,026,624 and 5,300,402. Other suitable dielectric materials include PSR4000™ produced by Taiyo, and Vacrel™ produced by Dupont. Preferably the dielectric material 14 is applied by screen printing, dipping, brushing, spray application, or vacuum or hot roll lamination of a dry film material to an applied thickness of from about 0.001 in (0.025 mm) to about 0.005 in (0.13 mm).

As indicated at block 52, the photoimage, able dielectric coating 14 is exposed to ultraviolet light, through a preformed mask which blocks the light from selected areas of the coating, thereby forming defined exposed and unexposed areas of photoimageable dielectric material 14 in the coating. The coating is then developed, as represented at block 54, with a suitable developer such as butyrolactone or propylene carbonate, which removes the unexposed material from the coating, leaving dielectric material 114 in the exposed areas and voids 16 in the unexposed areas, as illustrated in FIG. 1(a). As will be seen in the course of the following description of the manufacturing process embodying the present invention, the voids 16 provide vias, or holes, for interconnection between adjacent layers of electronics circuits and attachment sites 18 for surface-mounted electronic components 20, such as semiconductor chips, chip carriers, or other devices. Desirably, the dielectric material 14 remaining after development is only partially cured, as indicated at block 56, by heating the coating to a temperature of about 257° F. (125° C.) for about 30 minutes. The partial cure is sufficient to prevent the flow of dielectric material 14 during the following lamination step, and is less costly to carry out than full cure in an oven.

A layer of an electrically conductive material 22, such a copper foil having a thickness of from about 0.7 mil (18 µm) to about 4.0 mil (102 µm), is then laminated over the partially cured dielectric material 14, as indicated at block 58, by hot roll lamination followed by a curing bake, or in a lamination press. The curing bake is typically carried out at a temperature of about 365° to 392° F. (185° to 200° C.) which is maintained, either in an oven after hot roll lamination, or in lamination press, for about 2 hours.

After lamination, as indicated at block 60, the electrically conductive material 22 is circuitized using either conventional photoresist or subtractive etching processes to form defined circuit patterns. Photoresist processes apply a fight-sensitive coating which is selectively exposed and developed prior to chemical etching. The exposed areas serve as a mask for selective etching. After etching, the electrically conductive material 22 defines a desired circuit pattern having such elements as the designated chip attachment sites 18 and fan-out wiring, or full package wiring in thermal substrate applications. The term "chip" is used herein in a broad sense, and may comprise either a semiconductor chip, a semiconductor chip carrier, or other component that is directly attached to the surface of a circuit board. During the etching process, areas directly above the dielectric vias 16 are also etched if it is desired to provide a straight via opening through one or more of the layers of dielectric material 14. The partially formed electronic circuit assembly, after etching to form the desired circuit features, is represented schematically in FIG. 1(b).

Figure 1D:
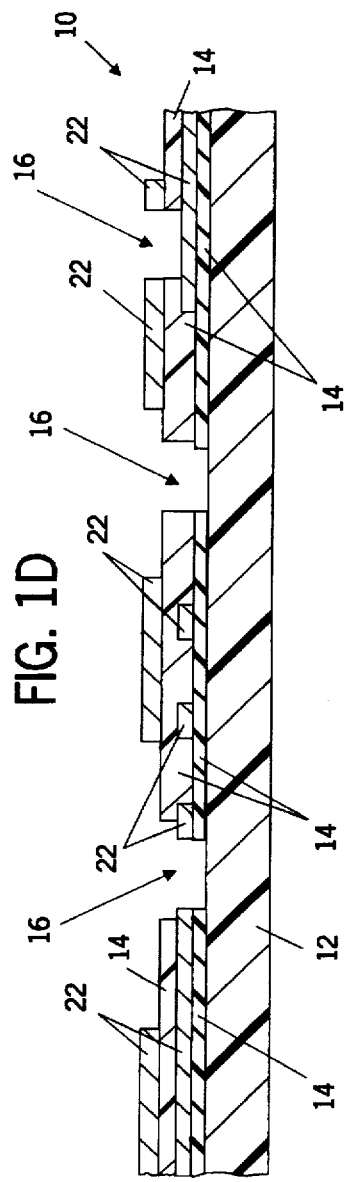

The above steps may be repeated sequentially as often as desired, until the desired number of electronic circuit layers are formed in the circuit assembly. As indicated by the dashed line between block 60 and block 62, the optional repetitive buildup of added layers begins with application of an additional coating of the photoimage able dielectric material 14 applied over the previously formed conductive circuit layer 22. As indicated by the dashed lines between block 62 and block 52, the previously described steps of exposing, developing, partial curing, laminating and circuit etching, are then repeated until the desired number of circuit layers are formed. Advantageously, vias 16, or other attachment clearances, are selectively formed in each layer of dielectric material 14 and, if desired in the layers of conductive material 22, in the manner described above. The cross-sectional appearance of the circuit assembly, after the formation of one additional dielectric layer 14 is shown in FIG. 1(c), and after the subsequent formation of one additional circuit layer 22, in FIG. 1(d).

Figure 1E:
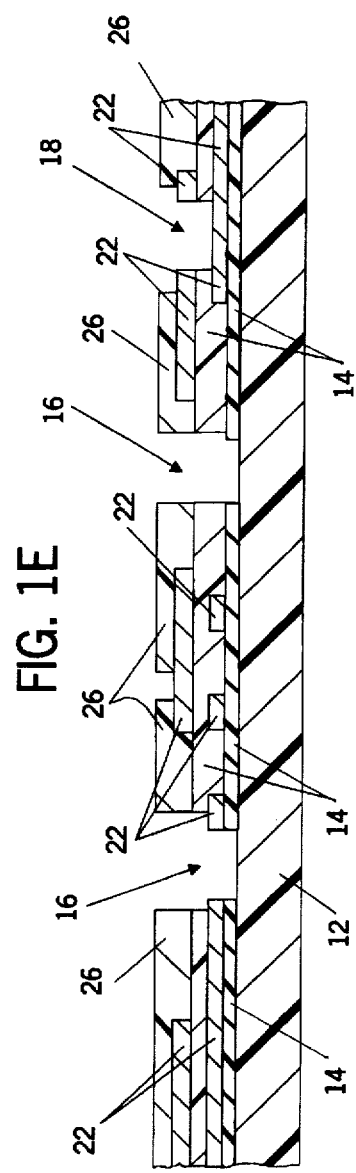

After formation of the last internal layer of electrically conductive material 22, an additional photoimageable dielectric layer 26 is applied as indicated at block 64, exposed as represented at block 66, developed as indicated at block 68, and then fully cured as shown at block 70. Vias 16, or other through openings are selectively formed in the additional dielectric layer 26 in the same manner as described in reference to the first-applied coating, after which the circuit assembly has an appearance represented by FIG. 1(e).

An additional circuit layer 28 is then formed, as indicated at block 72, on top of the last-added dielectric layer 26. The additional circuit layer 28 is desirably formed by first preparing the surface of the last-added dielectric layer 26 by physical or chemical means, i.e., vapor blasting, oxygen plasma, or permanganate etch, after which the surface is seeded by a suitable palladium treatment and a thin layer of conductive material, preferably copper, is applied to the surface by an electroless plating process. Once a thin layer of the conductive material is formed, the conductive material can be applied at a faster rate by conventional elecrolytic plating processes, until the desired conductive layer thickness is formed. All defined interconnections between circuit layers, including electrical connections provided by the stacked vias 16 16 are made during the plating process. Alternatively, if thick circuit lines are required in the top layer, a pre-drilled conductive foil, or full foil with via dot etch, can be laminated as in the previously described operation, followed by via plating. Vias 16, and other interlayer connection openings formed in accordance with the selective exposure and developing of the dielectric material 14 and selective etching of the circuit layers 22 as described above, enables a circuit assembly 10 to be formed with relatively small diameters, for example on the order of from about 0.001 in (0.025) to about 0.010 in (0.254 mm). The small diameter of the interlayer openings permit high circuit density and improved yield of the manufactured circuit assemblies.

Figure 1F:
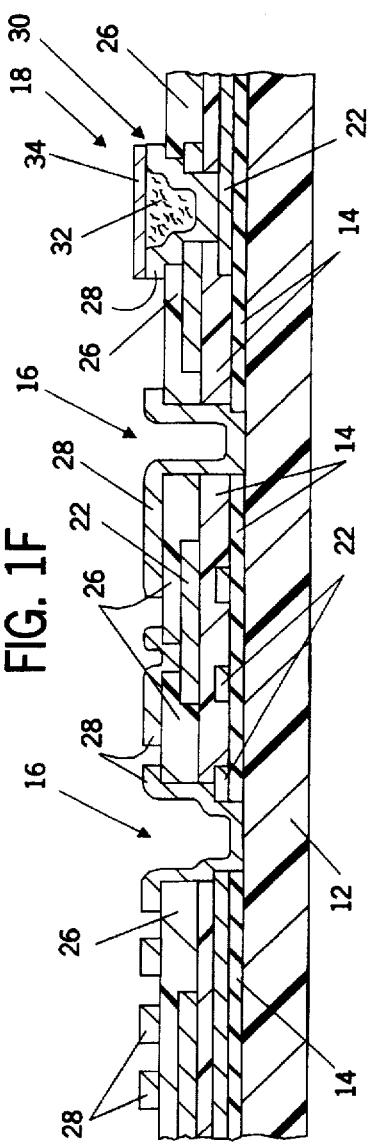

The last added conductive layer 28 is circuitized by etching as described above. The plated interconnection vias 16 are protected during the etching process, preferably with a photoresist. For certain applications, the electronic circuit assembly 10 may be ready for its intended use, and has an appearance as illustrated in the center and left portions of FIG. 1(f). However, in other applications, it is desirable to provide planar surface lands 30 to which the surface components 20 can be directly attached. The lands 30 are desirably formed by filling the defined via openings 16 in the dielectric layers 14,26 with an electrically conductive paste 32. The paste 32 may be applied by conventional screen printing techniques or dispensed by other means, into the vias 16. The conductive paste 32, if solvent-based, is then dried in an oven to drive the solvent from the paste. The drying process, if used, is generally not sufficient to fully cure the last- applied dielectric material 14,26 if it was not previously cured. A conductive metal foil 34, e.g. thin copper foil, is then laminated under temperature and pressure, as described above, to the last-applied dielectric material 14,26 and the conductive paste 32. During lamination, the last-applied layer of dielectric material 14,26 if not previous cured, is fully cured along with the conductive paste 32.

Following lamination of the conductive foil 34, the top foil is circuitized by conventional subtractive etching processes. The pattern on the top layer 34 preferably includes a planar surface land 30 at each of the surface component attachment sites, and fan-out/fan-in circuit lines for all previously unattached attachment sites. The circuit assembly 10, after formation of the surface attachment lands 30 has an appearance as represented at the fight portion of FIG. 1(f).

Optionally, as represented by the block 74, a suitable solder mask 36, such as the aforementioned IBM Advanced SolderMask is applied over the surface circuit pattern 34, exclusive of the surface attachment lands 30, as shown in the center and left sections of FIG. 2, to minimize corrosion and prevent the inadvertent application of solder on undesired portions of the surface circuit. The surface mounted components 20 may then be directly attached to the planar surface lands 30 by conventional direct chip attachment methods, or conditioned for component attachment by controlled collapse chip connection techniques, by deposition of a eutectic solder on the lands 30, as represented in the fight section of FIG. 2.

If desired, the electrically conductive paste 32 may also be used to provide electrical interconnection of adjacently disposed conductive circuits 22, as shown in FIG. 3. In this arrangement, interconnection holes are formed through the dielectric material 14 during the selective etching of the dielectric coating, and then the resultant void is filled with the electrically conductive paste 32, and the paste dried, if required, prior to lamination of the top circuit.

The above-described sequentially additive method for manufacturing an electronic circuit assembly can be carded out on either one, or both, sides of a substrate member 12. All of the preceding operations can be advantageously carded out simultaneously on the front and back sides of the starting substrate member 12.

A multiplicity of multi-layer signal/power carriers can be formed according to the above-described manufacturing method. For instance, processing can be done directly on a metal back plate/heat sink to create thermal carriers for power supply applications. In such applications, the thickness of the added layers is not limited by excessive plating times. The thin photoimageable dielectric layers 14,26 offer minimal thermal resistance, and thus provide excellent properties for thermal carriers. Also, the photoimageable dielectric material 14,26 permit high power components to be mounted directly to, or in close proximity with, a metal back plate.

Figure 5:
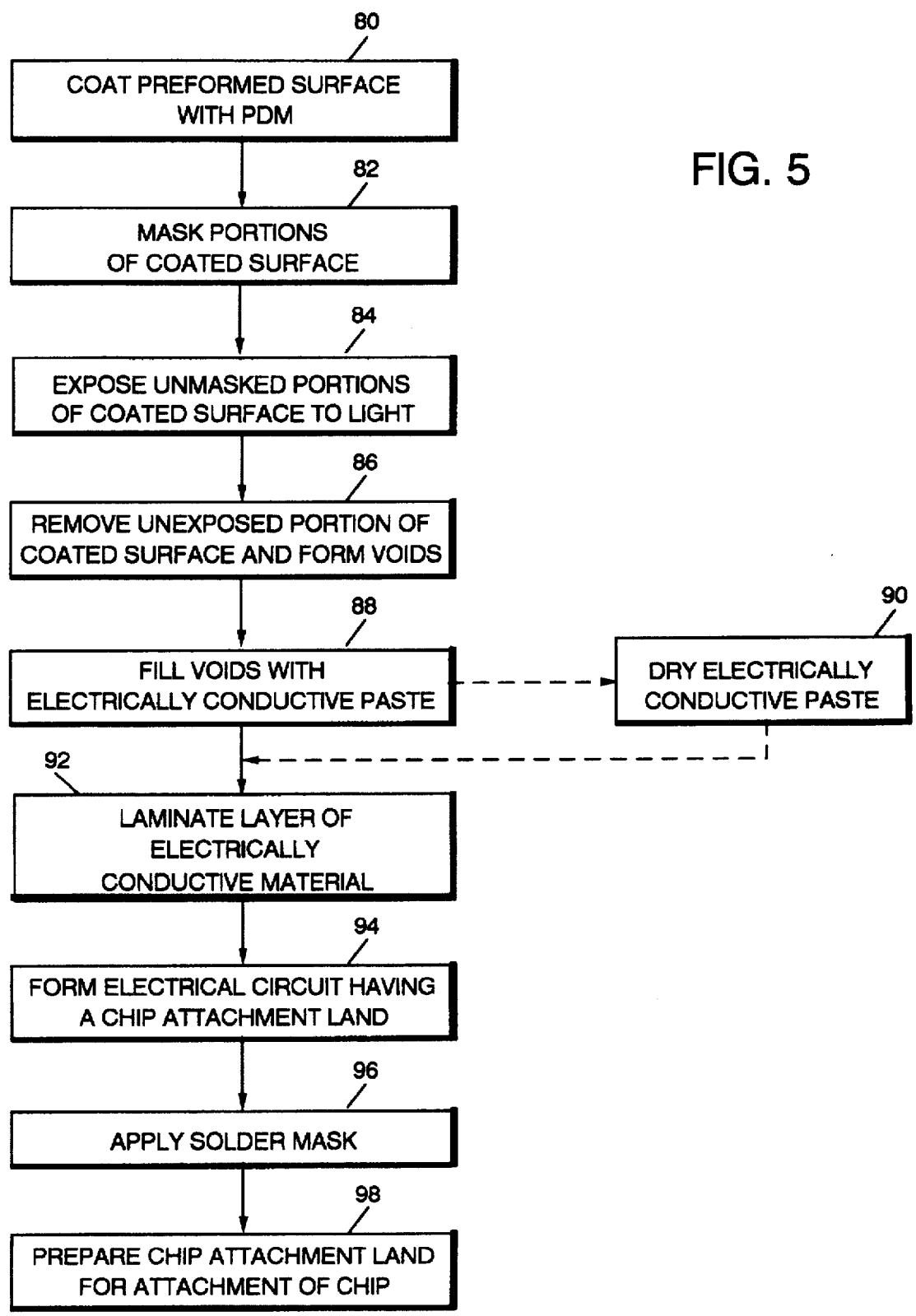
FIG. 5 is a block diagram illustrating the sequential operations carried out in the formation of a chip attachment site in accordance with an alternate embodiment of the manufacturing method embodying the present invention.

The manufacturing method embodying the present invention, in which an electrically conductive paste is used to provide sequential layer interconnection, may also be advantageously used to provide high density interconnections on preformed printed circuit board layers. As shown at block 80 in FIG. 5, a coating of photoimageable dielectric material is applied on the top, i.e., the direct chip attachment, side of a conventional printed circuit board, typically having a full chip C4 (controlled collapse chip connection) land pattern and some degree of fan-out/fan-in wires from the chip C4 grid to an acceptable card grid, for example 0.025 in (0.63 mm) or 0.050 in (1.3 mm). The PDM coating is masked, as indicated at block 82, exposed to ultraviolet light as represented at block 84, and unexposed portions of the dielectric coating developed away as indicated at block 86, as described above. Developed away areas of the dielectric coating include openings, i.e. vias, above each of the previously formed C4 lands and any other required interconnection sites.

A conductive paste is then deposited, as shown at block 88, into the vias formed in the dielectric coating. If the conductive paste contains a solvent, it is then dried in an oven, as indicated by the optional operation at block 90, to drive off the solvent from the paste but, as described above, such heating is generally not sufficient to fully cure the dielectric material. An electrically conductive foil, e.g., copper foil, is then laminated under temperature and pressure, in the manner described above and represented at block 92. The lamination temperature and pressure are sufficient to provide full cure of the dielectric and paste materials. The copper foil is preferably thin, e.g. ½ oz. or less, such that free features on the order of 0.002 in (0.05 mm) or less can be defined with conventional etching processes at high yield.

Following lamination of the conductive foil, the top layer is circuitized, as indicated at block 94, by conventional subtractive etching processes. The defined circuit pattern on the top layer preferably includes a replica of the C4 land pattern on the original surface of the printed circuit board, as well as fan-out/fan-in circuit lines for all previously unattached C4s.

A solder mask is then applied over the circuit pattern, as indicated at block 96, and the C4 lands are prepared, at block 98, for C4 attach, e.g., by either electroless Sn/Pb plate or reflow, solder dispense, or solder transfer.

The method, embodying the present invention, for manufacturing high density electronic circuit assemblies, is also easily applied to low and medium density external patterns where there is room for plated vias making interconnections to exposed surface features. The present invention is also applicable to organic chip modules or other flip chip, direct chip attachment applications. The wireability required for direct chip attachment is easily achieved by multi-level wiring.

Although the present invention is described in terms of a preferred exemplary embodiment, those skilled in the art will recognize that changes in photoimageable dielectric materials, in electrically conductive circuit material, and electrically conductive paste material may be made, consistent with the specifically stated required properties, without departing from the spirit of the invention. Likewise, via openings and interconnection holes may have other arrangements than those described and illustrated herein. Such changes are intended to fall within the scope of the following claims. Other aspects, features and advantages of the present invention may be obtained from a study of this disclosure and the drawings, along with the appended claims.

What is claimed is:

1. A method for manufacturing a high density electronic circuit assembly, comprising:

coating at least one planar surface of a substrate member with a photoimageable dielectric material;

exposing one or more portions of said photoimageable dielectric material coating to light, thereby forming defined exposed and unexposed areas of the photoimageable dielectric material coating on the surface of the substrate;

developing said coated surface of the substrate and thereby removing the unexposed photoimageable dielectric material from the surface of the substrate and forming defined open surface areas on the substrate;

partially curing the remaining exposed photoimageable dielectric material on the surface of the substrate;

laminating a layer of an electrically conductive material with said dielectric material and said substrate member, said dielectric material being disposed between said layer of electrically conductive material and said substrate and said laminating being carried out at a temperature and for a length of time sufficient to complete the curing of said dielectric material;

selectively etching said electrically conductive material and forming at least one first defined electrical circuit disposed on said dielectric material, applying an additional coating of a photoimageable dielectric material on said first defined electrical circuit and said cured dielectric material;

exposing one or more portions of said additional coating of photoimageable dielectric material to light, thereby forming defined exposed and unexposed areas of photoimageable dielectric material wherein at least a portion of said unexposed areas are selectively aligned with one or more selected portions of the first electrical circuit and selected ones of the open areas on said substrate;

developing said additional coating of photoimageable dielectric material and thereby removing the unexposed photoimageable dielectric material from the additional coating;

curing the remaining exposed photoimageable dielectric material on the additional coating and thereby forming a selectively disposed second layer of dielectric material;

selectively forming at least one additional electrical circuit, said additional electrical circuit being disposed on said additional layer of dielectric material, selected portions of the first defined electrical circuit, and selected ones of the open surface areas on said substrate member.

2. A method for manufacturing a high density electronic circuit assembly, as set forth in claim 1, wherein the coating of at least one planar surface of a substrate member includes coating two planar surfaces that are respectively disposed on opposed surfaces of the substrate member, and the subsequent steps of the method are carded out simultaneously on both of said opposed surfaces of the substrate member.

3. A method for manufacturing a high density electronic circuit assembly, as set forth in claim 1, wherein selectively forming at least one additional electrical circuit includes:

attaching an additional layer of electrically conductive material over said additional layer of dielectric material; and selectively etching said additional layer of electrically conductive material and thereby removing one or more portions of said additional layer of electrically conductive material.

4. A method for manufacturing a high density electronic circuit assembly, as set forth in claim 3, wherein said attaching an additional layer of electrically conductive material includes:

roughening the additional layer of dielectric material and forming a roughened surface thereon; and plating a layer of an electrically conductive material on said toughened surface of the additional layer of dielectric material, one or more selected portions of the first defined electrical circuit, and the open surface areas on said substrate member.

5. A method for manufacturing a high density electronic circuit assembly, as set forth in claim 3, wherein said attaching an additional layer of electrically conductive material includes laminating a layer of an electrically conductive material on said additional layer of dielectric material.

6. A method for manufacturing a high density electronic circuit assembly, as set forth in claim 1, wherein subsequent to selectively forming at least one additional electrical circuit, said method includes applying a coating of a solder-resistant dielectric material to selected portions of said additional electrical circuit, said first defined electrical circuit and said open surface areas on said substrate member.

7. A method for manufacturing a high density electronic circuit assembly, as set forth in claim 1, wherein after selectively etching said electrically conductive material and forming at least one first defined electrical circuit, said method includes repeating the coating of a photoimageable dielectric material on a previously formed electrical circuit and cured dielectric material, exposing one or more portions of the applied coating of photoimageable dielectric material to light thereby forming defined exposed and unexposed areas of photoimageable dielectric material, developing said applied coating of photoimageable dielectric material and thereby removing the dielectric material from the defined unexposed areas, partially curing the remaining exposed dielectric material and thereby forming a layer of partially cured dielectric material over selected portions of the previously formed electrical circuit and the cured dielectric material, laminating a layer of an electrically conductive material with said partially cured dielectric material at a temperature and for a length of time sufficient to complete the curing of said partially cured dielectric material, and selectively etching the most recently laminated layer of electrically conductive material, until said high density electronic circuit assembly has one or more electrical circuit layers formed therein.

8. A method for manufacturing a high density electronic circuit assembly, as set forth in claim 7, wherein said defined unexposed areas of photoimageable dielectric material formed during said exposing one or more portions of the applied coating of photoimageable dielectric material to light includes preselected sites for interconnection vias between a previously formed electrical circuit and a subsequently formed electrical circuit, and after developing said applied coating and removing the dielectric material from the defined unexposed areas said method includes filling said areas from which dielectric material was removed with an electrically conductive paste.

9. A method for manufacturing a high density electronic circuit assembly, as set forth in claim 7, wherein the coating of at least one planar surface of a substrate member includes coating two planar surfaces that are respectively disposed on opposed surfaces of the substrate member, and the subsequent steps of the method are carried out simultaneously on both of said opposed surfaces of the substrate member.

10. A method for manufacturing a high density electronic circuit assembly, as set forth in claim 7, wherein selectively forming at least one additional electrical circuit includes:
   attaching an additional layer of electrically conductive material over said additional layer of dielectric material; and
   selectively etching said additional layer of electrically conductive material and thereby removing one or more portions of said additional layer of electrically conductive material.

11. A method for manufacturing a high density printed circuit assembly, as set forth in claim 7, wherein said attaching an additional layer of electrically conductive material includes:
   roughening the additional layer of dielectric material and forming a roughened surface thereon; and
   plating a layer of an electrically conductive material on said toughened surface of the additional layer of dielectric material, one or more selected portions of the first defined electrical circuit, and the open surface areas on said substrate member.

12. A method for manufacturing a high density electronic circuit assembly, as set forth in claim 1, wherein said selectively forming at least one additional electrical circuit includes forming an electrical circuit having at least one site defined thereon for connection with a semiconductor chip, said method further comprising:
   coating the surface of the electronic circuit assembly, formed according the preceding method and having said defined connection site thereon, with a photoimageable dielectric material;
   masking selected portions of the coating which overlay said defined connection site;
   exposing the coating to a source of light whereby unmasked portions of the coating are exposed to the light and masked portions of the coating are unexposed to the light;
   developing said coating and thereby removing the unexposed portions of the coating whereat defined voids are formed in said coating at said defined connection site;
   filling said defined voids with an electrically conductive paste;
   laminating a layer of an electrically conductive material over said dielectric material and said electrically conductive paste, said laminating being carried out at a temperature and for a length of time sufficient to cure said dielectric material and said electrically conductive paste;
   forming at least one electrical circuit by selectively etching the laminated layer of electrically conductive material, said electrical circuit having a planar surface land adapted for the direct connection of a semiconductor chip thereon and aligned with the defined connection site on the previously formed underlying electrical circuit;
   applying a coating of a solder-resistant dielectric material to selected portions of said electrical circuit having said planar surface land, said planar surface land not being included in said selected portions and not being coated by said solder-resistant dielectric material; and
   conditioning said planar surface land for the direct attachment of a semiconductor chip.

13. A method for manufacturing a high density electronic circuit assembly, as set forth in claim 12, wherein said filling said defined voids with an electrically conductive paste includes filling said defined voids with said paste containing a liquid solvent, and said method subsequently includes:
   placing the thus formed electronic circuit assembly in an oven; and
   drying said conductive paste at a temperature and for a length of time sufficient to vaporize the liquid solvent and at least partially cure said conductive paste and said dielectric material.

14. A method for forming a semiconductor chip attachment site on a previously formed electronic circuit board having at least one site defined thereon for the attachment of a semiconductor chip, comprising:
   coating the surface of the circuit board having the site defined thereon with a photoimage, able dielectric material;
   masking the portion of the photoimageable dielectric material coating which overlays said defined site;
   exposing the coating to a source of light whereby unmasked portions of the coating are exposed to the light and masked portions of the coating are unexposed to the light;
   developing said coating and thereby removing the unexposed portions of the coating wherein a void are formed in said coating at said defined site;
   filling said void with an electrically conductive paste;
   laminating a layer of an electrically conductive material over said dielectric material and said electrically conductive paste, said laminating being carried out at a temperature and for a length of time sufficient to cure said dielectric material and said electrically conductive paste;
   forming at least one electrical circuit by selectively etching the laminated layer of electrically conductive material, said electrical circuit having a planar surface land adapted for the direct connection of a semiconductor chip and aligned with the defined site on the underlying electrical circuit;
   applying a coating of a solder-resistant dielectric material to selected portions of said electrical circuit having said planar surface land, said planar surface land not being included in said selected portions and not being coated by said solder-resistant dielectric material; and
   conditioning said planar surface land for the direct attachment of a semiconductor chip.

15. A method for forming a semiconductor chip attachment site, as set forth in claim 14, wherein said filling said void with an electrically conductive paste includes filling said void with a paste containing a liquid solvent, and said method subsequently includes:

placing the coated circuit board in an oven;

drying said conductive paste at a temperature and for a length of time sufficient to vaporize the liquid solvent and at least partially cure said conductive paste and said dielectric material.

* * * * *

UNITED STATES PATENT AND TRADEMARK OFFICE
CERTIFICATE OF CORRECTION

PATENT NO. : 5,665,650

DATED : September 9, 1997

INVENTOR(S) : LAUFFER et al

It is certified that error appears in the above-indentified patent and that said Letters Patent is hereby corrected as shown below:

| | |
|---|---|
| Column 3, line 42 | Delete "photoimage, able" and Replace with --photoimageable-- |
| Column 8, line 12 | Delete "carded" and Replace with --carried-- |
| Column 8, line 31 | Delete "toughened" and Replace with --roughened-- |
| Column 9, line 41 | Delete "toughened" and Replace with --roughened-- |
| Column 10, line 36 | Delete "photoimage, able" and Replace with --photoimageable-- |

Signed and Sealed this

Ninth Day of December, 1997

*Attest:*

BRUCE LEHMAN

*Attesting Officer*     Commissioner of Patents and Trademarks